United States Patent
Lamesch

(10) Patent No.: US 10,793,097 B2
(45) Date of Patent: Oct. 6, 2020

(54) CAPACITIVE MEASUREMENT CIRCUIT WITH SENSOR WIRING DIAGNOSTICS

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 160 days.

(21) Appl. No.: 16/073,246

(22) PCT Filed: Jan. 24, 2017

(86) PCT No.: PCT/EP2017/051402
§ 371 (c)(1),
(2) Date: Jul. 26, 2018

(87) PCT Pub. No.: WO2017/129552
PCT Pub. Date: Aug. 3, 2017

(65) Prior Publication Data
US 2019/0047502 A1    Feb. 14, 2019

(30) Foreign Application Priority Data
Jan. 26, 2016 (LU) .......................................... 92960

(51) Int. Cl.
*G01R 27/26* (2006.01)
*B60R 21/015* (2006.01)
(Continued)

(52) U.S. Cl.
CPC ........ *B60R 21/01532* (2014.10); *B60N 2/002* (2013.01); *H03K 17/955* (2013.01);
(Continued)

(58) Field of Classification Search
USPC .................................. 324/660–663, 666, 686
See application file for complete search history.

(56) References Cited

U.S. PATENT DOCUMENTS 8,354,936 B2    1/2013  Ootaka
2005/0253712 A1  11/2005  Kimura et al.
(Continued)

FOREIGN PATENT DOCUMENTS

EP    2400259 A1    12/2011
JP    2000283834 A  10/2000

OTHER PUBLICATIONS

International Search Report on International application No. PCT/EP2017/051402, dated Jan. 24, 2017, 4 pages.
(Continued)

*Primary Examiner* — Vincent Q Nguyen
(74) *Attorney, Agent, or Firm* — Reising Ethington P.C.

(57) ABSTRACT

A capacitance measurement circuit for determining a sense current of a capacitive sensor with a sense electrode and a guard electrode. The measurement circuit includes a periodic signal voltage source, a sense current measurement circuit configured for determining the sense current with reference to a reference voltage, and at least one remotely controllable switch member. In a first switching state, the at least one switch member electrically connects the sense current measurement circuit to the periodic signal voltage source for providing a first reference voltage, and in a second switching state, the at least one switch member electrically connects the sense current measurement circuit to a second reference voltage that is different from the first reference voltage.

16 Claims, 2 Drawing Sheets

US 10,793,097 B2
Page 2

(51) Int. Cl.
*B60N 2/00* (2006.01)
*H03K 17/955* (2006.01)

(52) U.S. Cl.
CPC ............ *H03K 2217/94089* (2013.01); *H03K 2217/960705* (2013.01); *H03K 2217/960735* (2013.01)

(56) References Cited

U.S. PATENT DOCUMENTS

| | | |
|---|---|---|
| 2006/0049834 A1 | 3/2006 | Umeda |
| 2006/0164254 A1 | 7/2006 | Kamizono et al. |
| 2011/0006790 A1* | 1/2011 | Kirkaune ........... G01N 33/2888 324/664 |
| 2015/0084317 A1 | 3/2015 | Togura et al. |
| 2018/0080802 A1* | 3/2018 | Urig ................. G01D 5/24 |

OTHER PUBLICATIONS

Written Opinion on International application No. PCT/EP2017/051402, dated Jan. 24, 2017, 7 pages.
Smith, J et al., Electric Field Sensing for Graphical Interfaces, IEEE Computer Graph. Appl., vol. 18, No. 3, May 1, 1998, pp. 54-60.

* cited by examiner

CAPACITIVE MEASUREMENT CIRCUIT WITH SENSOR WIRING DIAGNOSTICS

TECHNICAL FIELD

The invention relates to a capacitance measurement circuit, a capacitive sensing system comprising such capacitance measurement circuit, and a method of operating such capacitive sensing system with regard to capacitive sensor interruption diagnosis.

BACKGROUND OF THE INVENTION

Capacitive measurement and/or detection systems have a wide range of applications, and are among others widely used for the detection of the presence and/or the position of a conductive body in the vicinity of an electrode of the system. A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which could comprise the one or more antenna electrodes themselves—at which the influence of an object or living being on the electric field is detected.

The different capacitive sensing mechanisms are for instance explained in the technical paper entitled "*Electric Field Sensing for Graphical Interfaces*" by J. R. Smith et al., published in IEEE Computer Graphics and Applications, 18(3): 54-60, 1998. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling.

The capacitive coupling is generally determined by applying an alternating voltage signal to a capacitive antenna electrode and by measuring the current flowing from said antenna electrode either towards ground (in the loading mode) or into the second electrode (receiving electrode) in case of the coupling mode. This current is usually measured by means of a transimpedance amplifier, which is connected to the sensing electrode and which converts a current flowing into said sensing electrode into a voltage, which is proportional to the current flowing into the antenna electrode.

Some capacitive sensors are designed as sense-only capacitive sensors having a single sense electrode. Also, quite often capacitive sensors are used that comprise a sense electrode and a guard electrode that are proximally arranged and mutually insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

By way of example, patent document U.S. Pat. No. 8,354,936 B2 describes a capacitive passenger detector for a vehicle. The capacitive passenger detector includes a main electrode, a sub-electrode and a guard electrode. The main electrode and the sub-electrode are separated apart from each other, and disposed in a seat of a vehicle.

The guard electrode is disposed between the main electrode and a body of the vehicle, and separated apart from the main electrode. A sensitive characteristic measurement unit is configured for applying an alternating voltage signal to the main electrode, the sub-electrode and the guard electrode selectively or totally and for converting a current generated in the main electrode, the sub-electrode and the guard electrode to a voltage, respectively. The capacitive passenger detector further comprises a controller that defines a current flowing through the guard electrode to be a reference current when a voltage of the main electrode and a voltage of the guard electrode have the same potential. The controller defines a current flowing direction of the current flowing through the guard electrode to be a negative direction when the voltage of the main electrode is higher than the voltage of the guard electrode. The controller defines the current flowing direction of the current flowing through the guard electrode to be a positive direction when the voltage of the main electrode is lower than the voltage of the guard electrode. The controller corrects the voltage of the main electrode based on the current flowing through the guard electrode so that a corrected voltage of the main electrode is set to be a passenger determination data. Even when a potential difference is generated between the main electrode and the guard electrode, the controller detects the capacitance of the passenger correctly.

Capacitive sensing systems which are used in the control of airbag systems or other safety-related applications may be considered as safety-relevant system components. It may thus be useful to monitor the good functioning of the different components of the sensor (sensing electrode and/or guard electrode) in order to rule out a false reading by the capacitive occupancy or proximity detection system.

With the currently available systems, complexity and costs that are required for detecting a sensor interruption, in particular a guard electrode interruption, are quite high. Current solutions include means such as but not limited to a complex interruption measurement circuit indeed, a diode between the sensing electrode and the guard electrode, a four-wire cable for foil sensor, four crimps, four connector pins, etc.

SUMMARY

It is therefore an object of the present invention to provide a less complex diagnose concept for a capacitive sensing system, in particular for use in automotive applications.

In one aspect of the present invention, the object is achieved by a capacitance measurement circuit for determining a sense current of a capacitive sensor that includes at least one electrically conductive sense electrode and at least one electrically conductive guard electrode that are proximally arranged and are mutually galvanically separated from each other.

The term "galvanically separated", as used in this application, shall particularly be understood to not conduct a direct current (DC) between galvanically separated objects.

The suggested capacitance measurement circuit comprises

- a periodic signal voltage source that is configured for providing an alternating measurement voltage at an output port, wherein at least one of the at least one electrically conductive sense electrode and the at least one electrically conductive guard electrode is electrically connectable to the periodic signal voltage source for receiving the periodic measurement voltage,
- a sense current measurement circuit that is configured to determine, with reference to a reference voltage, the sense current that is indicative of a position of an object relative to the capacitive sensor, and
- at least one switch member that is remotely controllable by a switch remote control unit between at least a first switching state and a second switching state.

The configuration is such that

- in the first switching state, the at least one switch member electrically connects the sense current measurement circuit to the output port so as to provide the periodic measurement voltage as a first reference voltage for determining the sense current, and
- in the second switching state, the at least one switch member electrically connects the sense current measurement circuit to a second reference voltage that is different from the first reference voltage.

The term "being configured to", as used in this application, shall in particular be understood as being specifically programmed, laid out, furnished or arranged.

The term "electrically connectable/connected", as used in this application, shall be understood to encompass galvanic electrical connections as well as connections established by capacitive and/or inductive electromagnetic coupling.

It is further noted herewith that the terms "first" and "second" are used in this application for distinction purposes only, and are not meant to indicate or anticipate a sequence or a priority in any way.

The invention is based at least in part on an insight that a measurement error will occur if a sense electrode and a guard electrode of the capacitive sensor are not kept at exactly the same AC potential. By intentionally changing the reference voltage used for determining the sense current by connecting the sense current measurement circuit to the second reference voltage that is different from the first reference voltage, a signal can be generated by the sense current measurement circuit that can be indicative of an electrical interruption, wherein the interruption may include any interruption of electrical connections between the respective sense and guard cabling and connecting members.

The capacitance measurement circuit is preferably configured to determine an absolute difference between a first sense current value of the capacitive sensor, which is determined when said at least one switch member is in said first switching state, and a second sense current value of the capacitive sensor, which is determined when said at least one switch member is in said second switching state, and to generate an output signal that is indicative of a sensor interruption if the determined absolute difference is smaller than a predefined threshold value (AVtes) for the absolute difference of sense current.

One particular advantage of at least some embodiments of the invention is therefore that the signal that can be indicative of an electrical interruption is obtainable by a measurement of the sense current measurement circuit, in the same way as a regular measurement to determine the sense current that is indicative of a position of an object relative to the capacitive sensor is carried out. In this way, an effort for additional hardware that is required for detecting an electrical interruption can be kept low.

Another advantage lies in that a detection of an electrical interruption is independent of a capacitance value of a capacitor formed by the sense electrode and the guard electrode of the capacitive sensor, and is therefore in particular applicable for detecting electrical interruptions in a capacitive sensor with low capacitance values of the capacitor formed by the sense electrode and the guard electrode, i.e. in cases in which other methods for detecting electrical interruption are fundamentally ineffective.

Preferably, the periodic measurement voltage may be sinusoidal or square-wave shaped, and a fundamental frequency of the periodic measurement voltage lies in a range between 10 kHz and 10 MHz. In this frequency range, hardware components are cost-effective and readily available. The term "fundamental frequency", as used in this application, shall be understood particularly as a lowest sinusoidal frequency in a Fourier analysis of the periodic measurement voltage.

In a preferred embodiment, the capacitance measurement circuit further comprises a passive electrical circuit that is electrically connected to the output port of the periodic signal voltage source and that is configured for providing the second reference voltage. In this way, the second reference voltage can be provided in a simple and component-saving manner.

Preferably, the passive electrical circuit comprises a voltage divider. In this way, an amplitude of the signal generated by the sense current measurement circuit by intentionally changing the reference voltage used for determining the sense current can be defined for optimizing a signal difference obtained from a measurement with the at least one switch member in the first switching state versus a measurement in the second switching state.

Preferably, the switch remote control unit forms part of a microcontroller, by which a reliable and simple remote control of the at least one switch member and, in this way, a reliable detection of an electrical interruption can be enabled. Microcontrollers that are suitably equipped and include, for instance, a processor unit, a digital memory unit, a microcontroller system clock, a multiplexer unit and analog-to-digital converters are nowadays readily available in many variations.

In one preferred embodiment of the capacitance measurement circuit, the switch remote control unit is configured to periodically switch the at least one remotely-controllable switch member from the first switching state to the second switching state for a predetermined time period and back to the first switching state after the time period has elapsed. By selecting a suitable predetermined time period, a quasi-continuous monitoring for electrical interruptions can be accomplished, while the capacitive sensor is in an operative state.

In one preferred embodiment of the capacitance measurement circuit, the sense current measurement circuit comprises a transimpedance amplifier (current-to-voltage converter), and the at least one switch member is electrically connected to a reference input port of the transimpedance amplifier. In this way, a difference of a signal generated by the sense current measurement circuit by intentionally changing from the first reference voltage to the second reference voltage used for determining the sense current can readily be obtained. In embodiments, the capacitive sensing system may include a demodulation circuit that is configured for demodulating an output signal or an input signal of the sense current measurement circuit with reference to the periodic measurement voltage. If the demodulation circuit is configured for demodulating an input signal of the sense current measurement circuit, the demodulation circuit would be preferably connected to the reference input port of the transimpedance amplifier and the at least one switch member is accordingly electrically connected to the demodulation circuit.

In another aspect of the present invention, a capacitive sensing system is provided.

The capacitive sensing system includes
an embodiment of the capacitance measurement circuit disclosed beforehand,
a switch remote control unit for remotely controlling the at least one switch member, and
at least one capacitive sensor that is electrically connected to the periodic signal voltage source, wherein the at least one capacitive sensor includes at least one electrically conductive sense electrode and at least one electrically conductive guard electrode that are proximally arranged and mutually galvanically separated from each other.

In this way, a capacitive sensing system with an inherent detection means of little complexity for detecting electrical interruptions can be accomplished.

Preferably, the at least one capacitive sensor of the capacitive sensing system is configured for operation in loading mode.

Advantageously, the switch remote control unit forms part of a microcontroller. In this way, a reliable and simple remote control of the at least one switch member and a reliable detection of an electrical interruption can be achieved.

In some embodiments, the capacitive sensing system includes a demodulation circuit that is configured for demodulating an output signal or an input signal of the sense current measurement circuit with reference to the periodic measurement voltage. By that, an in-phase component and a quadrature component of the output signal of the sense current measurement circuit can readily and advantageously be obtained for further signal processing with reduced noise level, as is well known in the art.

Preferably, the demodulation circuit comprises at least one out of a demodulating synchronous rectifier and an electronic multiplying mixer. Further preferred, the demodulation circuit forms part of the transimpedance amplifier, and in particular the demodulation circuit and the transimpedance amplifier share a common housing, by which low signal distortion and/or low pick-up of electronic noise can be accomplished.

In yet another aspect of the invention, the object is achieved by a method of operating an embodiment of the capacitive sensing system as disclosed beforehand with regard to capacitive sensor interruption diagnosis.

The method includes steps of
controlling the at least one switch member to be in the first switching state,
determining a first sense current value of the capacitive sensor,
controlling the at least one switch member to be in the second switching state,
determining a second sense current of the capacitive sensor,
determining an absolute difference between the first sense current and the second sense current,
comparing the determined absolute difference with at least one predetermined threshold value for the absolute difference of sense current, and
generating an output signal that is indicative of a sensor interruption if the determined absolute difference is smaller than the predefined threshold value.

As capacitance values can be determined from determined sense currents, determining a sense current is equivalent to determining a capacitance value. Thus, the phrase "determining a sense current value", as used in this application, shall be understood to encompass determining any other physical quantity that is equivalent to the sense current, in particular an impedance or a voltage. By applying the suggested method, an effective monitoring for electrical interruption can be accomplished.

Preferably, the method further comprises steps that are to be executed if the determined absolute difference is equal to or larger than the predefined threshold value.

These steps are
controlling the at least one switch member to be in the first switching state, and
resuming determining sense current values of the capacitive sensor.

A quasi-continuous monitoring regarding electrical interruptions can be achieved, while at the same time the capacitive sensor operational availability is virtually unaffected, if the steps of the method are executed in a periodic manner.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 1:
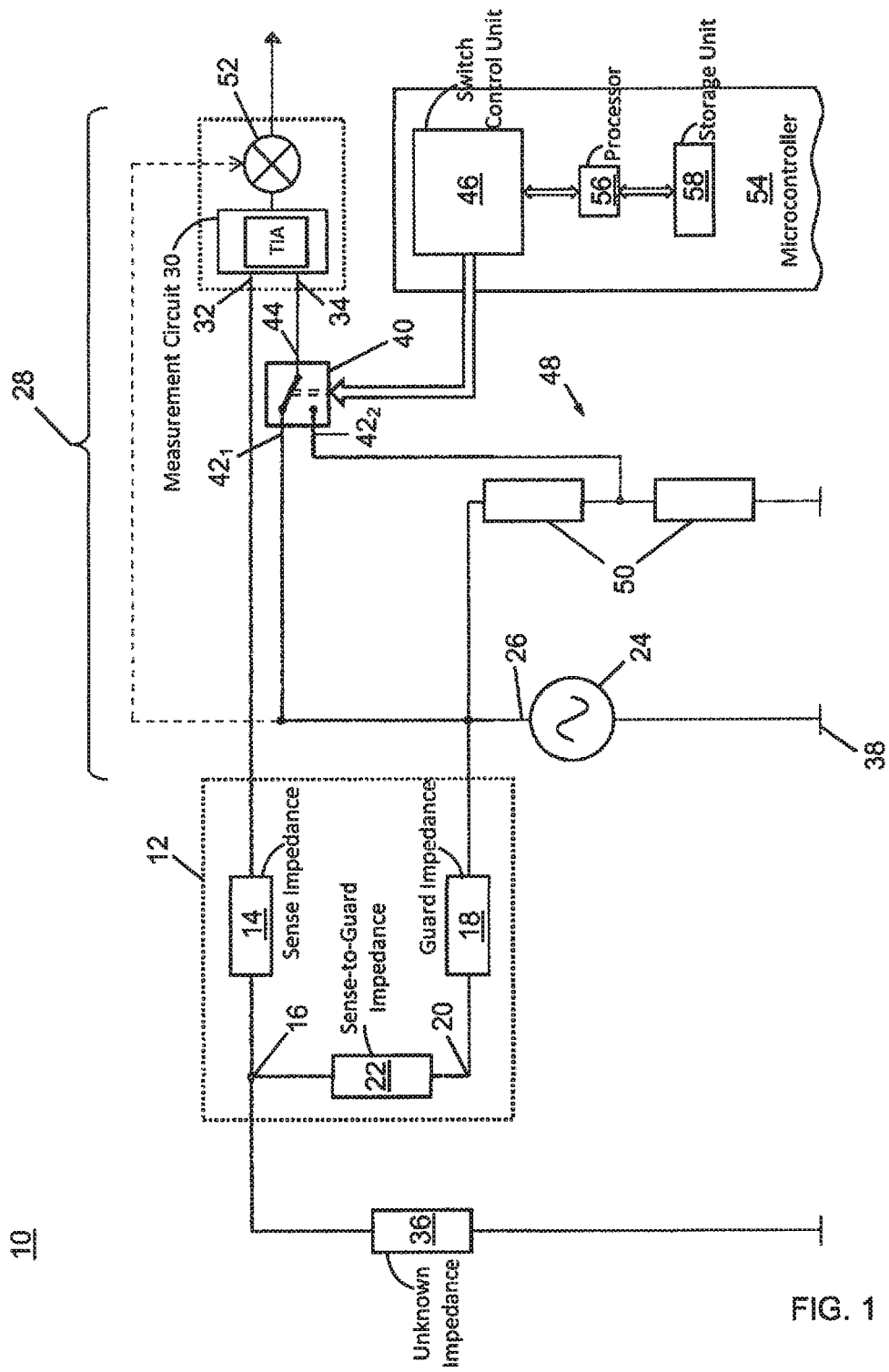
FIG. 1 illustrates an electric equivalent circuit diagram of a capacitive sensing system having a capacitance measurement circuit in accordance with an embodiment of the invention, with an electrically connected capacitive sensor.

FIG. 1 schematically illustrates an electric equivalent circuit diagram of a capacitive sensing system 10 having a capacitance measurement circuit 28 in accordance with an embodiment of the invention. The capacitive sensing system 10 further includes a capacitive sensor 12 and a switch remote control unit 46 whose function will be described thereinafter.

The capacitive sensor 12 comprises an electrically conductive sense electrode and an electrically conductive guard electrode that are proximally arranged and mutually galvanically separated from each other. The sense electrode is characterized by a sense impedance 14 that includes a sense wiring resistance ending at a sense node 16. The guard electrode is characterized by a guard impedance 18 that includes a guard wiring resistance ending at a guard node 20. A sense-to-guard impedance 22, mainly of capacitive nature, is electrically connected in parallel between the sense impedance 14 and the guard impedance 18. In this specific embodiment, the sense-to-guard impedance 22 has a capacitance of about 1 nF, but capacitive sensors with a higher or lower sense-to-guard capacitance are also contemplated.

The capacitance measurement circuit 28 includes a periodic, namely sinusoidal, signal voltage source 24 that is configured for providing an alternating measurement voltage at an output port 26. The guard electrode, represented by the guard impedance 18, is electrically connected to the periodic signal voltage source 24 for receiving the periodic measurement voltage, from where it is transferred to the guard node 20.

The capacitance measurement circuit 28 includes a sense current measurement circuit 30 that is electrically connected to the sense electrode and is configured for determining a sense current flowing through the sense electrode. The sense current measurement circuit 30 comprises a transimpedance amplifier (TIA) whose function is to convert the sense current provided at a signal input port 32 into an output voltage that is proportional to the determined sense current. The TIA is configured to convert the sense current with reference to a reference voltage that is provided to a reference input port 34.

The capacitive sensor 12 is configured for being operated in loading mode. The sense current is indicative of a position of an object relative to the capacitive sensor 12. An object approaching the sense electrode is represented in the electric equivalent circuit diagram of FIG. 1 by an unknown impedance 36 that is connected to a ground potential 38, which for instance may be a vehicle ground potential. If the grounded object approaches the sense electrode, the unknown impedance 36 changes in that at least its capacitive portion increases, and the sense current flowing between the sense electrode and ground potential 38 and, by that, an amplitude of the TIA output voltage signal is increased, indicating a closer proximity of the object to the capacitive sensor 12.

Furthermore, the capacitance measurement circuit 28 includes a switch member 40 that is remotely controllable by the switch remote control unit 46 between a first switching state and a second switching state. The switch member 40 is formed as a multiplexer which is controlled by a microcontroller 54. The multiplexer comprises a plurality of input ports 42, out of which two input ports $42_1$, $42_2$ are employed, and one output port 44. The multiplexer output port 44 is electrically connected to the reference input port 34 of the TIA.

The output port 26 of the signal voltage source 24 is electrically connected to a first one $42_1$ of the two employed multiplexer input ports $42_1$, $42_2$. In the first switching state, the multiplexer electrically connects the sense current measurement circuit 30, namely the reference input port 34 of the TIA to the output port 26 of the signal voltage source 24 so as to provide the periodic measurement voltage as a first reference voltage for determining the sense current. In the first switching state, the TIA is configured to convert the sense current provided at the signal input port 32 with reference to the periodic measurement voltage that is provided to the reference input port 34.

The capacitance measurement circuit 28 further comprises a passive electrical circuit 48 that is connected in parallel to the periodic signal voltage source 24. The passive electrical circuit 48 includes a voltage divider 50 including two impedances and is configured for providing a second reference voltage. To that end, in the second switching state, the multiplexer electrically connects the sense current measurement circuit 30, namely the reference input port 34 of the TIA to the center of the voltage divider 50 so as to provide a periodic measurement voltage of a lower amplitude as the second reference voltage for determining the sense current.

In the moment of intentionally transferring the switch member 40 from the first switching state to the second switching state, the voltage difference between sense electrode and guard electrode is not substantially zero any more, as it was before, and the measured sense current is now indicative of an impedance between sense node 16 and guard node 20 of the capacitance measurement circuit 28, which includes the sense wiring and guard wiring resistances. A difference in the TIA output voltage signal can be exploited for detecting an electrical interruption in the capacitive sensor 12 by applying a method described thereinafter.

The actual amplitude that is provided to the reference input port 34 of the TIA in the second switching state can be adjusted by selecting an appropriate value for a ratio of the impedances of the voltage divider 50. The absolute values of the impedances are preferably selected large enough to avoid putting too high a load on the periodic signal voltage source 24. In the second switching state, the TIA is configured to convert the sense current provided at the signal input port 32 with reference to a fraction of the periodic measurement voltage that is provided to the reference input port 34, meaning that the second reference voltage is different from the first reference voltage. In principal, it is also contemplated that the amplitude of the first reference voltage equals the amplitude of the periodic measurement voltage, and that the amplitude of the second reference voltage is equal or close to an amplitude of zero Volt.

As mentioned before, the multiplexer is controlled by a microcontroller 54. Further, the switch remote control unit 46 for remotely controlling the switch member 40 formed by the multiplexer forms part of the microcontroller 54 and is controllable by a processor unit 56 of the microcontroller 54.

The capacitive sensing system 10 further includes an electronic multiplying mixer as a demodulation circuit 52 that is configured for demodulating the TIA output voltage signal with reference to the periodic measurement voltage so as to obtain an in-phase portion of the TIA output voltage signal and a quadrature portion of the TIA output voltage signal for further signal processing and noise reduction.

The microcontroller 54 comprises a plurality of digital-to-analog converters (not shown) for digitally converting the in-phase portion and the quadrature portion of the TIA output voltage signal, respectively, and is configured for recorded the digitally converted signal portions in a digital data storage unit 58.

Figure 2:
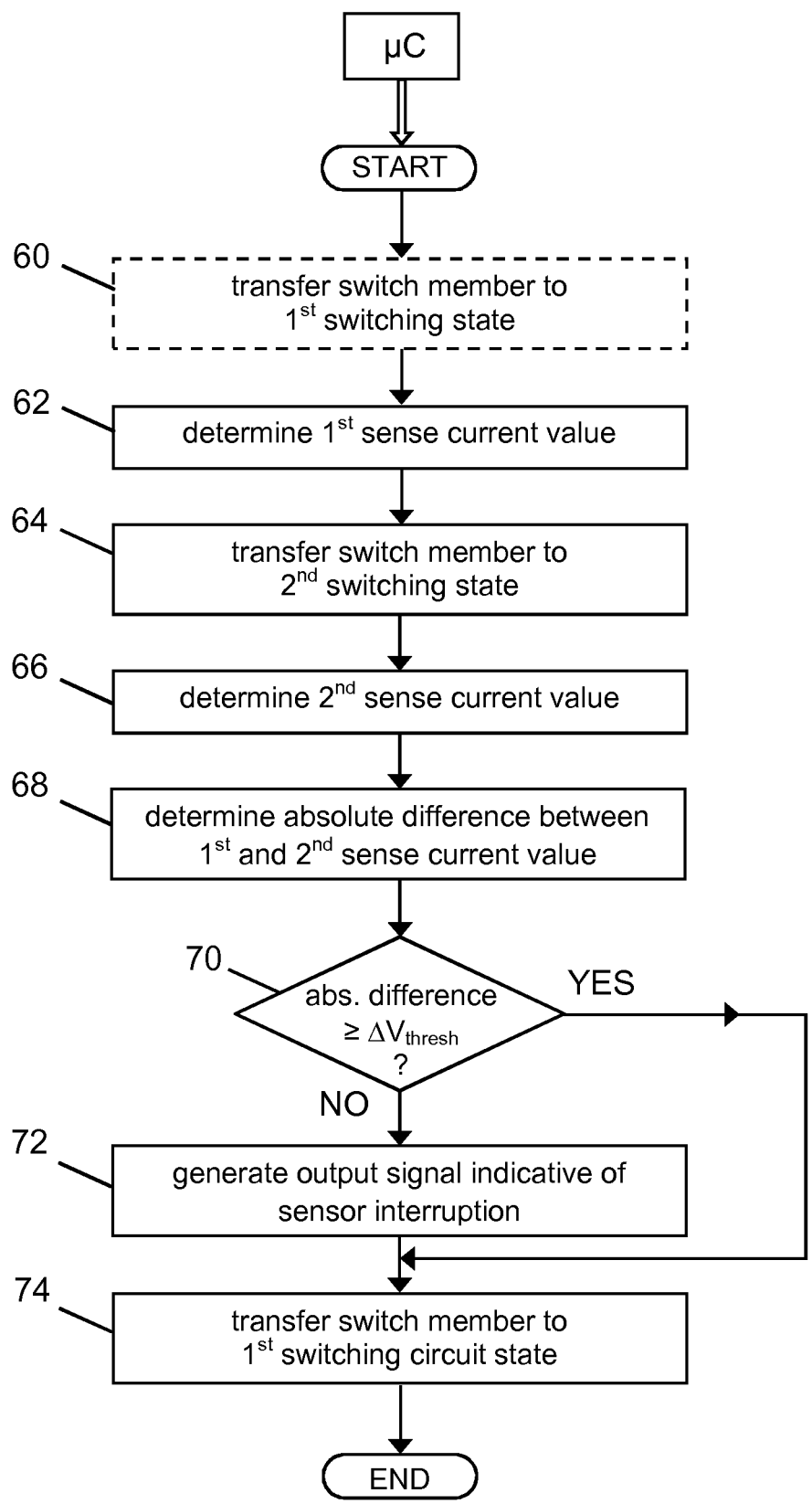
FIG. 2 is a flow chart of a method of operating the capacitive sensing system pursuant to FIG. 1.

In the following, an embodiment of a method of operating the capacitive sensing system 10 with regard to capacitive sensor interruption diagnosis will be described. A flowchart of the method is given in FIG. 2. In preparation of using the capacitive sensing system 10, it shall be understood that all involved units and devices are in an operational state and configured as illustrated in FIG. 1.

In a first step 60 of the method, the switch member 40 is controlled by the switch remote control unit 46 to be in the first switching state. If the method is started with the capacitance measurement circuit 28 in its regular operating mode, the switch member 40 should be in the first switching state already, and the step 60 is merely a check of the state of the switch member 40, or the step 60 can be omitted. In the next step 62, a first sense current value of the capacitive sensor 12 is determined by the sense current measurement circuit 30. As described beforehand, determining a sense current is equivalent to determining a TIA output voltage signal that is indicative of the unknown impedance 36.

In another step 64, the switch member 40 is controlled by the switch remote control unit 46 to be in the second switching state for a predetermined time period. Within this time period, a second sense current value of the capacitive sensor 12 is determined by the sense current measurement circuit 30 in a following step 66.

In the next step 68, an absolute difference between the first sense current and the second sense current (or, equivalent, between the first determined TIA output voltage amplitude and the second determined TIA output voltage amplitude) is determined by the microcontroller 54. Alternatively, an absolute difference between the in-phase portions of the first determined TIA output voltage amplitude and the second determined TIA output voltage amplitude and an absolute difference between the quadrature portion of the first determined TIA output voltage amplitude and the second determined TIA output voltage amplitude are determined. The microcontroller 54, in the following step 70, compares the determined absolute difference with a predetermined threshold value $\Delta V_{thresh}$ for the absolute difference of TIA output voltage amplitude, and generates an output signal that is indicative of a capacitive sensor interruption in another step 72 if the determined absolute difference is smaller than the predefined threshold value $\Delta V_{thresh}$ (in the alternative version, the microcontroller 54 compares the determined absolute difference of the in-phase portions with a first predetermined threshold value for the absolute difference of TIA output voltage amplitude, and the determined absolute difference of the quadrature portions with a second predetermined threshold value for the absolute difference of TIA output voltage amplitude). The microcontroller output signal may be transferred to another control unit, for instance a vehicle control unit in the case of automotive applications, by which it may be further processed and by which additional steps may be taken. Or, the microcontroller output signal may be displayed on a display unit for alarming a user.

If the determined absolute difference is equal to or larger than the predefined threshold value $\Delta V_{thresh}$, the switch member 40 is controlled by the switch remote control unit 46 to be in the first switching state again in the next step 74 after the predetermined time period has elapsed. In the following step carried out by the microcontroller 54, the determining of sense current values of the capacitive sensor 12 is resumed, as no electrical interruption in the capacitive sensor 12 has been detected.

The microcontroller 54 is configured to initiate the steps of the method in a periodic manner, for instance with a period of 1 s. In this way, a quasi-continuous monitoring for electrical interruption within the capacitive sensor 12 can be established, and an operational availability of the capacitive sensor 12 remains virtually unaffected.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitance measurement circuit for determining a sense current of a capacitive sensor including at least one electrically conductive sense electrode and at least one electrically conductive guard electrode that are proximally arranged and mutually galvanically separated from each other, the capacitance measurement circuit comprising:
   a periodic signal voltage source that is configured for providing an alternating measurement voltage at an output port,
   a sense current measurement circuit that is configured to determine, with reference to a reference voltage, the sense current that is indicative of a position of an object relative to the capacitive sensor, and
   at least one switch member that is remotely controllable by a switch remote control unit between at least a first switching state and a second switching state, wherein in the first switching state, the at least one switch member electrically connects the sense current measurement circuit to the output port of the periodic signal voltage source so as to provide the periodic measurement voltage as a first reference voltage for determining the sense current, and wherein in the second switching state, the at least one switch member electrically connects the sense current measurement circuit to a second reference voltage that is different from the first reference voltage,
and wherein said capacitance measurement circuit is configured to:
   determine an absolute difference between a first sense current value of the capacitive sensor, which is determined when said at least one switch member is in said first switching state, and a second sense current value of the capacitive sensor, which is determined when said at least one switch member is in said second switching state, and
   generate an output signal that is indicative of a sensor interruption if the determined absolute difference is smaller than a predefined threshold value for the absolute difference of sense current.

2. The capacitance measurement circuit as claimed in claim 1, further comprising a passive electrical circuit that is connected to the output port of the periodic signal voltage source and that is configured for providing the second reference voltage.

3. The capacitance measurement circuit as claimed in claim 2, wherein the passive electrical circuit comprises a voltage divider.

4. The capacitance measurement circuit as claimed in claim 1, wherein the switch remote control unit forms part of a microcontroller.

5. The capacitance measurement circuit as claimed in claim 1, wherein the switch remote control unit is configured to periodically switch the at least one remotely-controllable switch member from the first switching state to the second switching state for a predetermined time period and back to the first switching state after the time period has elapsed.

6. The capacitance measurement circuit as claimed in claim 1, wherein the sense current measurement circuit comprises a transimpedance amplifier, and the at least one switch member is electrically connected to a reference input port of the transimpedance amplifier.

7. A capacitive sensing system including:
a capacitance measurement circuit as claimed in claim 1,
a switch remote control unit for remotely controlling the at least one switch member, and
at least one capacitive sensor that is electrically connected to the periodic signal voltage source, wherein the at least one capacitive sensor includes at least one electrically conductive sense electrode and at least one electrically conductive guard electrode that are proximally arranged and mutually galvanically separated from each other.

8. The capacitive sensing system as claimed in claim 7, wherein the at least one capacitive sensor is configured for being operated in loading mode.

9. The capacitive sensing system as claimed in claim 7, wherein the switch remote control unit forms part of a microcontroller.

10. The capacitive sensing system as claimed in claim 7, further including a demodulation circuit that is configured for demodulating an output signal of the sense current measurement circuit with reference to the periodic measurement voltage.

11. The capacitive sensing system as claimed in claim 7, further including a demodulation circuit that is configured for demodulating an input signal of the sense current measurement circuit with reference to the periodic measurement voltage.

12. A method of operating the capacitive sensing system as claimed in claim 7 with regard to capacitive sensor interruption diagnosis, the method comprising steps of:
controlling the at least one switch member to be in the first switching state,
determining a first sense current value of the capacitive sensor,
controlling the at least one switch member to be in the second switching state,
determining a second sense current value of the capacitive sensor,
determining an absolute difference between the first sense current value and the second sense current value,
comparing the determined absolute difference with at least one predetermined threshold value for the absolute difference of sense current, and
generating an output signal that is indicative of a sensor interruption if the determined absolute difference is smaller than the predefined threshold value.

13. The method as claimed in claim 12, wherein when the determined absolute difference is equal to or larger than the predefined threshold value ($\Delta V_{thres}$), the method further comprising the steps of:
controlling the at least one switch member to be in the first switching state, and
resuming determining sense current values of the capacitive sensor.

14. The method as claimed in claim 12, wherein the steps are executed in a periodic manner.

15. A capacitance measurement circuit for determining a sense current of a capacitive sensor including at least one electrically conductive sense electrode and at least one electrically conductive guard electrode that are proximally arranged and mutually galvanically separated from each other, the capacitance measurement circuit comprising:
a periodic signal voltage source that is configured for providing an alternating measurement voltage at an output port,
a sense current measurement circuit that is configured to determine, with reference to a reference voltage, the sense current that is indicative of a position of an object relative to the capacitive sensor, and
at least one switch member that is remotely controllable by a switch remote control unit between at least a first switching state and a second switching state, wherein in the first switching state, the at least one switch member electrically connects the sense current measurement circuit to the output port so as to provide the periodic measurement voltage as a first reference voltage for determining the sense current, and wherein in the second switching state, the at least one switch member electrically connects the sense current measurement circuit to a second reference voltage that is different from the first reference voltage,
and wherein said capacitance measurement circuit further comprises a voltage divider that is connected to the output port of the periodic signal voltage source and that is configured for providing the second reference voltage.

16. The capacitance measurement circuit as claimed in claim 15, wherein said capacitance measurement circuit is configured to:
determine an absolute difference between a first sense current value of the capacitive sensor, which is determined when said at least one switch member is in said first switching state, and a second sense current value of the capacitive sensor, which is determined when said at least one switch member is in said second switching state, and
generate an output signal that is indicative of a sensor interruption if the determined absolute difference is smaller than a predefined threshold value for the absolute difference of sense current.

* * * * *